United States Patent [19]

Mercure et al.

[11] Patent Number: 4,616,176

[45] Date of Patent: Oct. 7, 1986

[54] DYNAMIC CURRENT TRANSDUCER

[75] Inventors: Hubert P. Mercure, Beloeil; Michel G. Drouet, St-Bruno, both of Canada

[73] Assignee: Hydro Quebec, Montreal, Canada

[21] Appl. No.: 570,082

[22] Filed: Jan. 12, 1984

[30] Foreign Application Priority Data

Feb. 8, 1983 [CA] Canada .................................. 421127

[51] Int. Cl.[4] .......................... G01R 1/20; H01F 15/04
[52] U.S. Cl. .................................. 324/127; 174/35 R; 336/82; 336/84 C
[58] Field of Search ................. 324/127, 126, 96, 157; 336/82, 84 C, 83; 174/35 R

[56] References Cited

U.S. PATENT DOCUMENTS

| | | | |
|---|---|---|---|
| 1,213,174 | 1/1917 | Faszler | 336/82 |
| 1,278,234 | 9/1918 | Sessions | 336/82 |
| 1,478,262 | 12/1923 | Snodgrass et al. | 336/82 |
| 4,070,572 | 1/1978 | Summerhayes | 324/96 |
| 4,374,359 | 2/1983 | Missout | 324/126 |

FOREIGN PATENT DOCUMENTS

| | | | |
|---|---|---|---|
| 1151242 | 8/1983 | Canada . | |
| 400719 | 12/1942 | Italy | 336/82 |
| 229881 | 3/1925 | United Kingdom . | |

OTHER PUBLICATIONS

Lebeda et al, "Bobines de Rogowski Pour la Mesure Precise due Courant" pp. 387–389.

IEEE, "Transient Response of Current Transformers" *Power Systems Relaying Committee of the IEEE Power Engineering Society*, pp. 1–12, (Jan., 1976).

Hortopan et al, "Etude, Realisation et Performances de Shunts Coaxiaux Pour la Mesure Precise de Courants de Courts-Circuits Eleves" pp. 332–343.

Pearson Electronics, Inc., "Application Notes for Current Transformers Manufactured by Pearson Electronics, Inc." pp. 1–7.

Beaudet et al, "Technique, Applicable to Circuit Breakers, for the Measurement of the Spatial Distribution . . . " pp. 1054–1062.

Pellinen et al, "Rogowski Coil for Measuring Fast, High-Level Pulsed Currents" *Rev. Sci. Instrum.* 51(11), Nov. 1980, pp. 1535–1540.

M. Murano et al, "Current Zero Measurement for Circuit Breaking Phenomena" IEEE, pp. 1–8.

*Primary Examiner*—Ernest F. Karlsen
*Attorney, Agent, or Firm*—Schwartz, Jeffery, Schwaab, Mack, Blumenthal & Evans

[57] ABSTRACT

The current transducer is of the type comprising a Rogowski coil extending around a first conducting element in which a current to be detected flows. The first conducting element is provided at one end with a first terminal connector. A second conducting element is mounted on the first one so as to cover and preferably embed the external periphery of the coil. The second conducting element is electrically connected to the first conducting element at the end thereof which is opposite to the one end provided with the first terminal connector. A second terminal connector is provided on the second conducting element on the same side of the plane of the coil as the first terminal connector. This arrangement forces the current flowing between the first and second terminal connectors via the first and second conducting elements to flow around the periphery of the coil and thus to shield the coil.

34 Claims, 8 Drawing Figures

DYNAMIC CURRENT TRANSDUCER

BACKGROUND OF THE INVENTION

1. Field of the Invention

The present invention relates to an improved dynamic current transducer that can be used in any electrical circuit in which the variations of current with respect to the time are substantial and are to be analyzed even if they are very short, or in any electrical equipment and/or component in which a high power alternating current has to be measured over a very long period of time, or even in a permanent manner.

Therefore, the invention relates to an improved, dynamic current transducer that can be used, for example, as an unsaturable current monitor subject to minimal internal heating, for the development of high power electrical equipment such as high power, high voltage circuit breakers, commutators or lightning arresters. Similarly, the improved, dynamic current transducer according to the invention can be used for replacing a current transformer in a high voltage transmission line.

2. Discussion of Related Art

It is known that the measurement of the amount of post-arc current in a circuit breaker is essential for understanding the various phenomena which are specifically related to the operation of one given breaker. Indeed, it is known that the quality of a circuit breaker depends on the intensity and of the rate of decrease of this post-arc current which is usually small (lower than 10 amps) and has a very sharp rate of decrease (a few microseconds). On the other hand, it is known that the development of a circuit breaker which has a good frequency response, a large output voltage and a heavy duty breaking capability, depends on the measurement of the amount of post-arc current and of the rate of decrease of current at nearly 0 amps of the circuit breaker.

The measure of the dynamic evolution of the small current which follows the interruption of high current when a circuit breaker is tripped gives important information that can be used to determine the efficiency and capabilty of a circuit breaker and thus its quality.

However, it is also known that the measurement of this small current following the interruption of high current in a circuit breaker is very difficult to carry out in practice and has required up to now the use of very sophisticated methods (see, for example, the article of M. Murano et al., IEEE, P.E.S. Winter Meeting, paper NO. T-75-70-8, 1975).

One of these methods makes use of shunts of increasing sensitivity, which are successively switched on when the current decreases towards zero amps, (see G. Hortopan et al., Revue Generale de l'electricite, no. 5, pages 332 to 343, 1981). Another method used for measuring this small current makes use of transformers with saturable cores, such as those manufactured and sold by Pearson Electronics, Inc., or of transformers with Hall effect cores.

If these known methods have some advantages, they all have drawbacks too.

Thus, for example, in the first method mentioned hereinabove, the use of a given number of shunts connected in parallel require operation and synchronization of solid state or electro-mechanical control means, or of one or more additional circuit breakers having a very high frequency response. The use of such additional circuit breakers is required to protect the shunts in the high current phase.

On the other hand, the second method mentioned hereinabove has major drawbacks too. By way of example, the transformers with saturable cores usually have a frequency response which is very small (see the article entitled "Transient response of current transformer" IEEE Power Engineering Society, Power System Relaying Committee, 76-CH-1130-4 TWR, 1976). Similarly, the transformers with Hall effect cores require a very substantial active system and a high power supply.

The other methods known in this field, such as those using high responsive diodes connected in parallel with shunts in order to filter the high signal peaks, are not very convenient and are often inaccurate.

SUMMARY OF THE INVENTION

An object of the present invention is to provide a dynamic current transducer which advantageously overcomes the above mentioned drawbacks by handling high currents without shielding and without being saturated before interruption by a circuit breaker, thus making the measurement of the small current following this interruption not only possible but very easy to carry out.

Another object of the present invention is to provide a dynamic current transducer which basically consists of a transformer having a very small inductance and a structure which is unique in that it makes use of the current conductor as the primary and of a toroidal coil with an air core inserted in a cavity machined in the sensor's body around the conductor as the secondary.

The use of a toroidal coil mounted around and in a plane perpendicular to a conductor in which a current flows, for acting as a secondary relative to this conductor and thus allowing measurement of the current flowing in this conductor, is well known in the art. This kind of toroidal coil, which comprises a given number of turns wound onto a dielectric core having a constant or even not constant cross-section over its length, is usually called a "Rogowski coil" and the use of such a coil as a current sensor has been made the subject matter of numerous scientific studies and numerous developments (see, for example, D. P. Pellinen et al, Rev. Sci. Instrum. volume 51, No. 11, pages 1535 to 1540, November 1980, or the article S. Lebada et al., Revue Brown Boveri, No. 10/11, pages 12 to 14 1981).

In a Rogowski coil, the electromotive force or output voltage $\epsilon$ generated at the terminals of the coil by a current I flowing in a conductor passing through the coil is given by the equation:

$$\epsilon = Ri \quad \text{(I)}$$

in which R is a reading resistance connected between the terminals of the coil, and i is the intensity of the current flowing in the windings of the coil. Assuming that the capacitance of the coil is negligible, the intensity i of the current flowing in the coil is related to the variation of the flux inside the coil according to the following equation:

$$\frac{1}{Z} \frac{d\phi}{dt} = \frac{L}{Z} \frac{di}{dt} + i \quad \text{(II)}$$

in which Z is the total impedance viewed by current i (that is, the sum of the reading resistance R, the resistance of the windings of the coil and the skin effect resistance of the coil which depends on the frequency), and L is the total self inductance of the coil.

When the central axis of the Rogowski coil is aligned with the conductor, the flux induced in the coil is related to the intensity I of the current flowing in the conductor according to the following equation:

$$\phi(t) = \frac{N \cdot A \cdot \mu_o \cdot I(t)}{2\pi r} \quad \text{(III)}$$

in which:

N is the total nunmber of turns of the coil;
A is the constant cross-sectional surface are of each turn of the coil along the length of the same;
$\mu_o$ is the magnetic permeability of air; and
r is the mean radius of the coil.

If the structural characteristics of the coil are suitably selected, it is possible to obtain $$\frac{L}{Z} \frac{di}{dt} << i \quad \text{(IV)}$$

this can be obtained for example when use is made of and alternating current of frequency ω, by making the ratio of the coil inductance to the coil impedance very small as compared with the pulse width. This can be expressed as follows:

$$\frac{L\omega}{Z} << 1 \text{ or } \frac{L}{Z} << \frac{T}{2\pi} \quad \text{(V)}$$

In this case, equation II reads as follows:

$$i = \frac{1}{Z} \frac{d\phi}{dt} \quad \text{(VI)}$$

and the combination of equation VI with equations I and III, gives:

$$\epsilon = \frac{R}{Z} \cdot \frac{N \cdot A \cdot \mu_o}{2\pi r} \frac{dI}{dt} \quad \text{(VII)}$$

This equation VII can be simplified as follows:

$$\epsilon = k \frac{dI}{dt} \quad \text{(VIII)}$$

in which k is a constant specific to the Rogowski coil in the very specific range of operation of this coil.

In the very specific case previously described, the Rogowski coil acts as a differentiating coil, since the voltage ε generated at the terminals of this coil is proportional to the derivative of the excitation current I with respect to time.

It should be noted here that if the structural parameters of the coil are selected so that:

$$\frac{L}{Z} \frac{di}{dt} >> i \quad \text{(IX)}$$

the integration of equation II gives:

$$i = (\phi/L) \quad \text{(X)}$$

and the combination of this equation with equation I gives:

$$\epsilon = KI \quad \text{(XI)}$$

in which K is a constant equal to R/N in the case where current I is an alternating current.

In this other specific case, the Rogowski coil acts as a self-integrating coil and it can be used as such, for example, as a saturable core transformer.

The main advantage of using a Rogowski coil giving an output voltage proportional to the derivative of the excitation current with respect to the time instead of giving an output voltage proportional to the current itself, or in other words, of using a differentiating Rogowski coil instead of using a self-integrating Rogowski coil as is used in numerous types of current transformers, is obvious. Indeed, differentiation of the current permits, on one hand, to avoid the saturation phenomena which are generally encountered (the coil having not the magnetizable core which is necessary when a very high ratio L/Z is requested at low frequency), and, on the other hand, to prevent very high current from damaging the coil since, in this case, i=I/N.

However, up to now, the use of differentiating coils has been systematically avoided by numerous specialists working in high current technology because of some drawbacks such as those mentioned on page 1536 of the above mentioned article of P. G. Pellinen et al., Rev. Sci. Instrum., volume 51, no. 11, November 1980. One of these major drawbacks lies in that the coil may generate a very high output voltage upon fast variation of a high current in the conductor. This voltage is dangerous for the operator and damaging for the measuring system. Moreover, when one wants to integrate the output voltage of the coil for measuring the current flowing to the conductor, a small parasitic current similar to the continuous offset current encountered at a low frequency is integrated simultaneously with the output voltage and this substantially reduces the sensitivity of the final result. This major drawback has justified in most cases, the non utilization of the Rogowski coil even though this coil has the advantage of an unsaturable core and is less subject to damage from high current.

According to the present invention, this major drawback can be easily overcome by judiciously adapting the structure of the coil support to shield and electrically insulate the coil while ensuring a high measurement sensitivity in a predetermined range of operation and by keeping the structure shape and side of the whole assembly simple, convenient and small.

As aforesaid, the dynamic current transducer according to the present invention is of the type comprising a Rogowski coil extending around a first conducting element in which the current to be detected flows. The first conducting element is provided at one end with a first terminal connector and a second conducting element is mounted to the first one so as to cover and preferably embed the external periphery of the coil. The second conducting element is electrically connected to the first conducting element at the end thereof which is opposite to the one end provided with the first terminal connector. The second conducting element is also provided with a second terminal connector mounted on the same side of the plane in which the coil extends as the first terminal connector. Because of this very specific structure, the current to be detected, which flows in the first conducting element and passes through the center of the coil, also flows in the second conducting element around the periphery of the coil, thereby shielding the same.

The dynamic current transducer according to the invention can be used with a self-integrating coil or with a differentiating coil. However, for the various reasons mentioned hereinabove, use will preferably be made of a differentiating coil; that is, of a coil whose parameters are selected in such manner that the ratio of the coil self-inductance with respect to the total impedance viewed by the coil is much smaller than the period of the current to be detected when this current is alternating. In this very specific case, the output voltage at the terminals of the coil is directly proportional to the variation of current in the conductor, and the ratio of this conversion voltage/current can be very easily varied by mere selection of the shape, parameters and electrical characteristics of the coil.

According to a preferred embodiment of the invention, the first conducting element comprises a solid, cylindrical body having a diameter smaller than the internal diameter of the coil, and a solid base extending perpendicularly to the body and having a diameter larger than the external diameter of the coil. The second conducting element comprises a sleeve having an internal diameter slightly larger than the external diameter of the cylindrical body to avoid any contact with the same when the first and second elements are connected together. Of course, the sleeve must have an external diameter sufficient to contact the external periphery of the base all around the coil to shield the same.

According to another preferred embodiment of the invention, a third box-shaped element is fixed onto the base of the first conducting element for receiving a pretreatment circuit for the signals produced by the sensor. This pretreatment circuit advantageously comprises a signal converter for converting the output voltage signal generated at the terminals of the coil into an optical signal, and a fiber optic transmitter for transmitting the optical signals from the converter to the outside of the box-shaped element.

The pretreatment circuit can be supplied by one or more rechargeable batteries. It can also be supplied by an integrating transformer which is itself supplied by current tapping elements attached to the sensor.

A further object of the present invention is to provide an apparatus for measuring a current, which comprises an improved dynamic current transducer, as defined hereinabove, connected by an optic fiber to a receiving converter. The receiving converter comprises a photo-diode having a frequency pass band substantially identical to the one of the converter of the transducer. The photo-diode produces an output signal directly proportional to the variation of current flowing through the sensor with a sensitivity substantially constant under a high current phase or under a transitory phase such as the one encountered with a post-arc current. The receiving converter may also comprise an amplifying integrator for treating the output signal of the photo-diode.

The main advantage of the dynamic current transducer according to the invention is that it can be used without any constraints or control in the high current phase of a transmission line as well as in the short transitory phase of a small post-arc current with substantially the same sensitivity in both cases. Thus, the dyanmic current transducer according to the invention can be used, for example, for measuring the frequency multiples of a current superior to the nominal frequency of this current or for measuring pertubations of a line current such as flickers or magnetic storm current, or partial discharges in conductors or equipment under voltage. Two other advantages of the dynamic current transducer according to the invention are its simplicity of construction and of operation and its small size. Other advantages of the dynamic current transducer according to the invention are that the measurement can be recorded with standard equipment and that its frequency response is uniform over a range as wide as 0.1 Hz to 100 MHz.

Because of its structure, the dynamic current transducer according to the invention is shielded against electromagnetic noises and against inductive or capacitive coupling with adjacent circuitry or equipment. Moreover, as the transducer has a very low inductance, its insulation requirements are very small even for a very fast variation of current.

Finally, when use is made of such a transducer in a measuring apparatus, the signal can be recorded using an analog transmission medium such as, for example, an optic fiber, thereby making the fidelity of the measuring apparatus much higher.

Thus, the dynamic current transducer according to the invention is faster, simpler, better insulated and more compact than the sensors presently used for monitoring the post-arc current of a circuit breaker to be developed. As the transducer according to the invention is unsaturable and has minimum internal heating, it can be used in any circuit operating under high alternating current and in any equipment subject to impulses such as those generated by lightning. The transducer according to the invention can also be used for replacing a current transformer in a transmission line operating under high or very high voltage as a control and measurement apparatus.

BRIEF DESCRIPTION OF THE DRAWINGS

The invention and its various advantages will be better understood upon reading the following description of several preferred embodiments thereof, with reference to the accompanying drawings in which.

DESCRIPTION OF PREFERRED EMBODIMENTS

Figure 1:
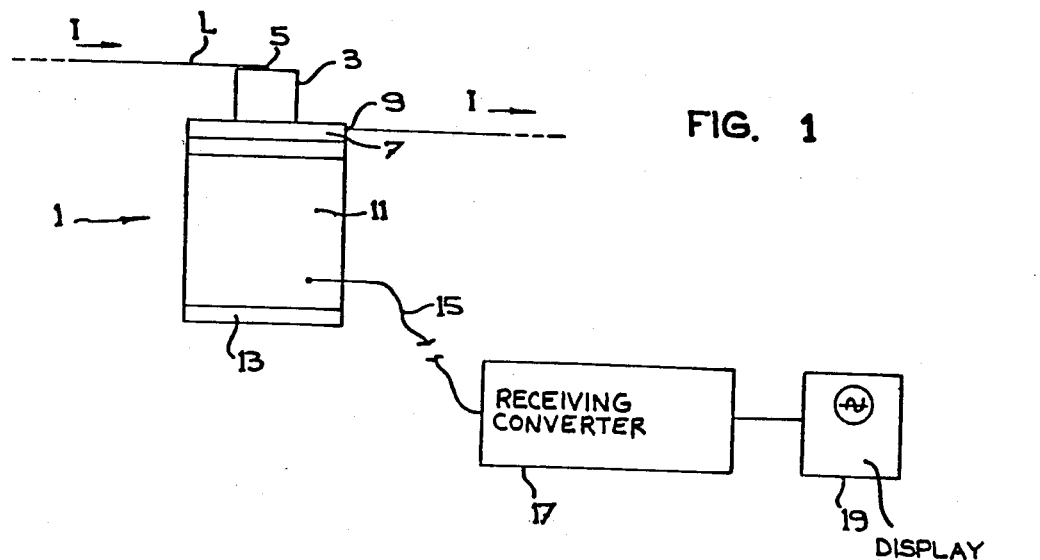
FIG. 1 is a schematic view of an apparatus for measuring a current, incorporating a dynamic current transducer according to the invention.

The apparatus for measuring a current schematically illustrated in FIG. 1, comprises a dynamic current transducer 1 connected in series by means of two terminal connectors 5 and 9 to a line L in which a current I to be measured flows. As will be described in greater detail hereinafter, the dynamic current transducer 1 comprises a first conducting element 3 at one end of which extends terminal connector 5, a second conducting element 7 on which is mounted a second terminal connector 9 and a third, box-shaped conducting element 11 provided with a bottom wall 13.

A pretreatment circuit that will be described in detail hereinafter, is located inside the box-shaped element 11 and connected to a receiving converter 17 by an optic fiber 15. Use of such an optic fiber transmission is required because of the insulation problems generally encountered in the case of high voltage transmission lines (735 kV). The receiving converter 17 may incorporate an apparatus for displaying or recording the signal detected and converted, or it can be separately connected to such an apparatus 19 for displaying or recording such signal.

Figure 2:
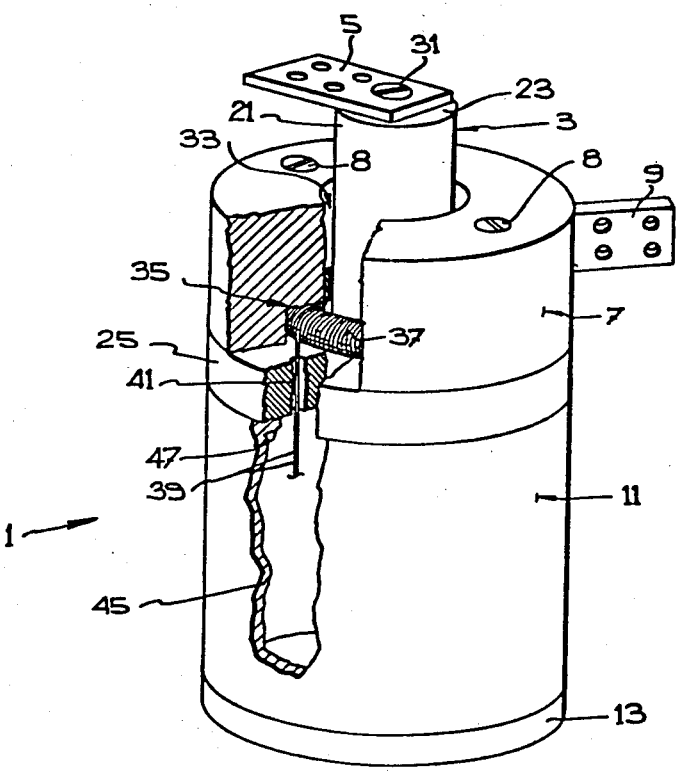
FIG. 2 is a part fragmentary perspective view of the dynamic current transducer shown in schematic manner in FIG. 1.
Figure 3:
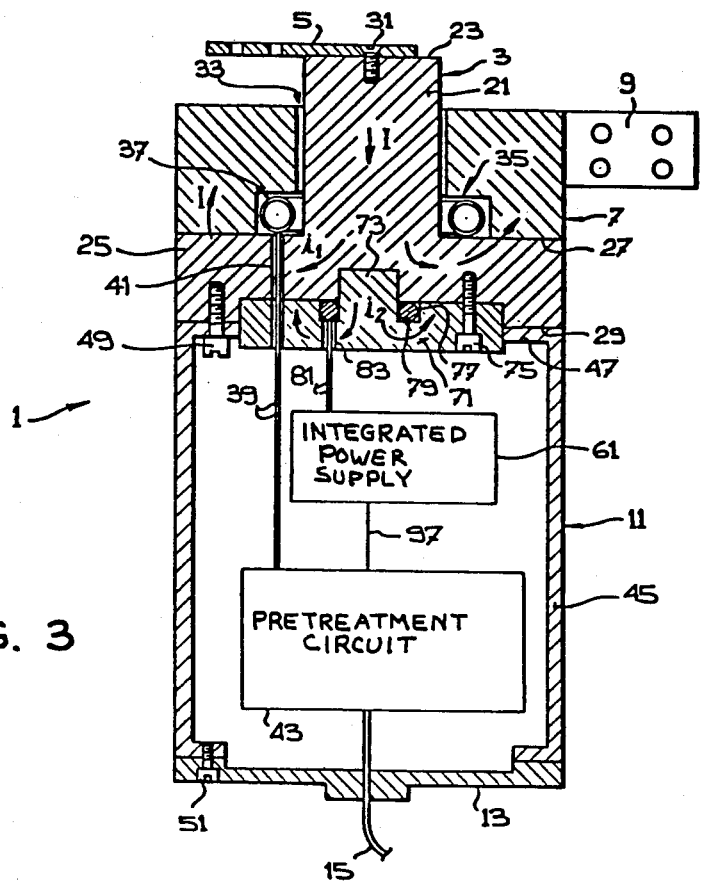
FIG. 3 is a cross-sectional view of the dynamic current transducer shown in FIG. 2.

As shown in FIGS. 2 and 3, the dynamic current transducer 1 comprises, as the main element, a Rogowski coil 37 mounted between the first and second conducting elements. This coil acts as a current transformer with a very small inductance, at the terminals 39 of which is generated a voltage $\epsilon$ which, according to the predetermined geometrical and electrical parameters of the coil, can be either proportional to the derivative of the current I flowing in the line L with respect to time, or directly proportional to this current I.

For the various reasons previously mentioned in the preamble of the present disclosure, these parameters are preferably selected so that the coil is a differentiating coil and the voltage $\epsilon$ is proportional to the derivative of the current I flowing in the line L.

In this regard, it should be noted that the coil operates with the same predetermined sensitivity regardless of the symmetry or asymmetry in amplitude or frequency of the current to be measured.

According to the preferred embodiment shown in FIGS. 2 and 3, the first conducting element 3 comprises a solid, cylindrical body 21 having a diameter smaller than the internal diameter of the coil. The cylindrical body 21 extends perpendicularly to a solid base 25 which forms an integral part of the conducting element 3 and has an external diameter larger than the external diameter of the coil. The upper end 23 of the cylindrical body 21, which is opposite to the base, is used for fixing the terminal connector 5. This connector, which can be of any conventional structure, can be fixed to the end 23 by means of one or several screws 31. The non-permanent fixation of the connector 5 is particularly advantageous since it can be necessary in some cases to remove the connector 5 in order to assemble the various structural elements of the sensor.

The second conducting element 7 of the transducer is shaped and mounted onto the first conducting element 3 so as to cover and preferably completely embed the external periphery of the coil. The element 7 is also shaped so as to be electrically connected to the first conducting element 3 only at the other end thereof which is opposite to the end provided with the first terminal connector 5.

The second conducting element 7 may consist of a large sleeve having an external diameter substantially identical to the external diameter of the base 25 of the first conducting element 3. The internal diameter of the element 7 is selected so as to be slightly greater than the external diameter of the cylindrical body 21 of the first conducting element 3 to avoid any electrical contact with the same when the element 7 is mounted onto the element 3. The selection of the sizes of the internal diameter of the second conducting element 7 and of the external diameter of the cylindrical body 21 of the first conducting element 3 is also made so that the space 33 separating these elements from each other when the same are assembled is sufficiently wide to prevent any insulation break-down, while being sufficiently small to allow the coil 37 to be embedded as much as possible inside the transducer 1 and therefore be shielded as much as possible.

To receive the coil 37, the internal periphery of the lower end 27 of the sleeve 7 in contact with the base 25 may comprise an annular recess 35 wide enough to receive and hold the coil 37.

Figure 4:
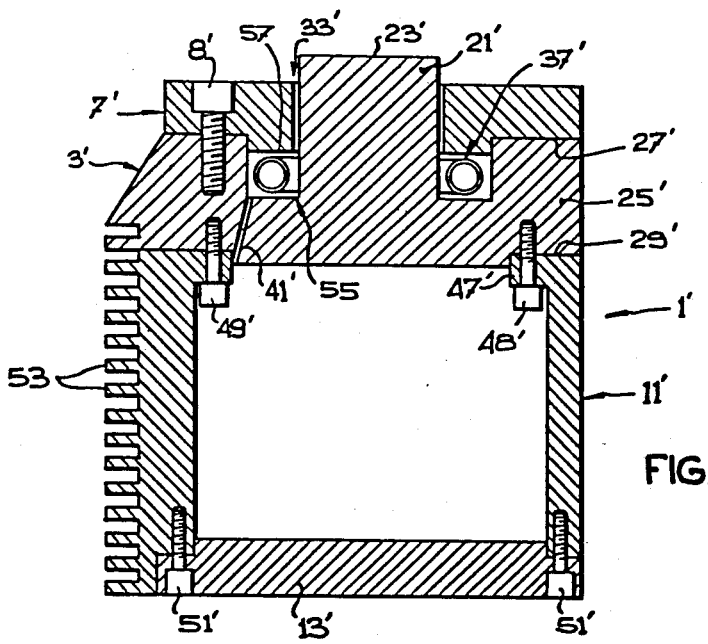
FIG. 4 is a cross-sectional view of another dynamic current transducer according to the invention.

According to another embodiment of the invention shown in FIG. 4, wherein all the elements similar to those shown if FIGS. 2 and 3 have been identified with the same reference numerals with the addition of a prime "'"; the coil 37' is located in an annular groove 55 provided in the base 25' at the foot of the cylindrical body 21' instead of being located in an annular recess as shown in FIGS. 2 and 3. In this particular case, the internal periphery of the lower end of the sleeve 7' in contact with the upper surface of the base 25' is advantageously provided with an annular shoulder 57 of small height, forming an integral part of the conducting element or sleeve 7'. The shoulder 57 is sized and positioned to match and engage the groove 55 provided in the base 25' of the sensor as clearly shown in FIG. 4. This engagement advantageously ensures self-positioning of the second conducting element 7' with respect to the first one by insertion of the shoulder 57 forming part of the element 7' in the annular groove 55 of the element 3'.

In both of these embodiments, the elements 3 and 7 can be fixed to each other by any suitable means, such as, for example, screws or bolts 8 inserted into corresponding threaded holes.

As previously indicated, the second conducting element carries the second terminal connector 9. It is compulsory that this second terminal connector be mounted on the same side of the plane of the coil as the first terminal connector 5. Indeed, this particular arrangement is necessary to efficiently shield the coil, since it forces the current not only to flow between the terminal connectors 5 and 9 through the first conducting element 3 in the middle of the coil, but also through the base 25 and the sleeve 7 all around the external periphery of the coil as shown with small arrows in FIG. 3. The particular structure of the sensor thus forces the current to flow through the middle of the coil, which is an essential condition for the measurement of this current, and simultaneously to externally shield the coil. In the meantime, the primary inductance of the transducer is minimal, thereby making the sensor operative over a very wide pass band.

The terminal connector 9 can be fixed in a removable manner as is the terminal connector 5, by means of any suitable means such as screws.

It should be noted that a small hole 41 can advantageously be provided through the base 25 of the first conducting element 3 to provide an exit for the output terminals 39 of the coil 37.

When the current to be measured is tapped from a high voltage transmission line such as those operating at 735 kV, the output voltage $\epsilon$ at the terminals 39 of the coil 37 cannot be used and treated at the vicinity of the sensor because of the insulation problems encountered. Therefore, the transducer 1 previously described can advantageously incorporate a pretreatment circuit to transmit the output voltage of the coil to a position remote from the line L to prevent the measured data from being altered.

To do so, the transducer 1 can be provided with the third element 11 previously referred to, which is box-shaped to contain and protect a pretreatment circuit 43 that will be described hereinafter in detail.

As shown in FIGS. 2 and 3, the box-shaped element 11 comprises a cylindrical housing 45 having an external diameter equal to the external diameter of the base 25. The cylindrical housing 45 is provided with an inwardly projecting peripheral edge 47 at its upper end, and with a small, inwardly projecting, peripheral edge at its lower end. The edge 47 can be used for fixing the housing 45 to a lower surface 29 of the base 25 by means of screws or bolts 49 inserted into threaded holes 48. The peripheral edge at the other end of the housing permits the bottom wall 13 to be removably fixed by means of screws or bolts 51. The advantage of having such a bottom wall 13 easily removable is to give access to the pretreatment circuit 43 inside the housing 45, and, of course, to facilitate the fixation of the housing 45 onto the base 25 of the transducer.

The box-shaped element 11 thus forms an integral part of the sensor when it is attached thereto, and protects the pretreatment circuit 43 which is connected to a receiving converter 17 as shown in FIG. 1, by means of any insulated transmission line such as an optic fiber 15.

To prevent any overheating phenomena, the various structural elements of the transducer can advantageously be provided with cooling fins 53 as shown in FIG. 3. These fins may extend over the entire surface of the sensor or over one part thereof, depending on the construction requirement.

Figure 6:
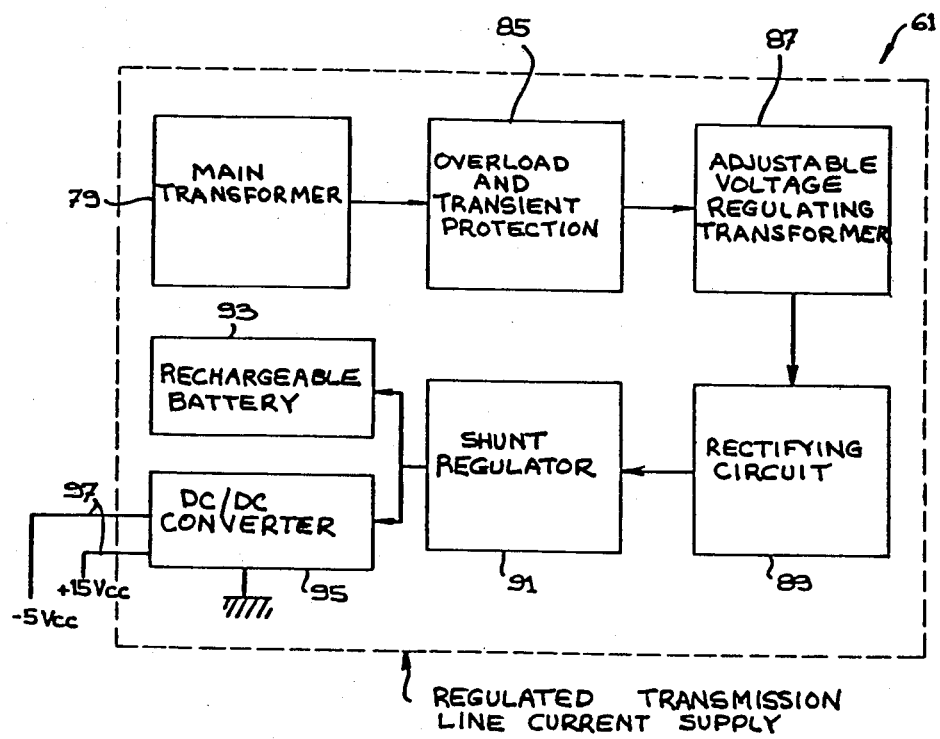
FIG. 6 is a block diagram of the integrated transmission line current supply used in the dynamic current transducer shown in FIG. 3.

Referring now to FIGS. 3 and 6, the circuit 43 for pretreating the output voltage of the Rogowski coil 37 can be supplied with rechargeable batteries. However, use can also be made of an integrated power supply circuit 61 comprising a main transformer integrally connected to the structure of the sensor. This particular arrangement is advantageous in that no external connection is necessary to energize the pretreatment circuit, provided that the alternating current to be measured or the alternating current includng variations of current to be measured, has a sufficient intensity and duration.

The integral main transformer forming part of the sensor consists of a toroidal coil 79 located in an annular groove 77 provided in a fourth conducting element 71 that can be fixed directly under the base 25 of the conducting element 3 by means of screws or bolts 75. To facilitate positioning and self-centering of this fourth conducting element 71, a central rod 73 can be provided as shown in FIG. 3.

The fourth conducting element 71 which is in direct contact with the first conducting element, acts as a current tapping element through which part of the current I flowing in a conducting element 3 passes. The tapped part $i_2$ of the current flowing through the fourth element 71 in the middle of the coil 79 generates an output voltage at the terminals 80 of this coil that can be transmitted via a small hole 83 to the integrated power supply circuit 61.

The coil 79 consists of a number of turns wound onto a toroidal core that can be made of ferrite. To obtain an output supply current of sufficient intensity, it is compulsory that the fourth conducting element 71 attached to the bottom of the base of the transducer in the middle of the same has surfaces in contact with the base of such size that a sufficient, predetermined derivation of the current be obtained. Such a derivation gives an output voltage to the terminals 81 of the coil 79 which is sufficient to supply the pretreatment circuit (about 300 mW in a permanent manner, which correspond to 5 volts and 60 mAmps in the case of the analog transmission described hereinafter). Depending on the areas of the inner and outer surfaces of the fourth conducting element 71 in contact with the base, the intensity of the current tapped by the fourth conducting element 71 can be easily adjusted to the power requirement of the pretreatment circuit whenever necessary.

In addition to the coil 79, the integrated power supply circuit 61 comprises an overload and transient protection circuit 85 for protecting its other electronic elements as well as the pretreatment circuit 43 against high current and high voltage. The circuit 61 also comprises an adjustable voltage regulating transformer 87 for protecting the pretreatment circuit against fast variation of the current. Moreover, the integrated power supply circuit 61 comprises a rectifying circuit 89 and a shunt regulator 91 connected, on one hand, to a set of rechargeable batteries 93 and, on the other hand, to cc-cc converter 95 whose terminals are connected to the pretreatment circuit. As can be easily understood, the current tapped by derivation not only supplies the pretreatment circuit 43 via the converter 95, but also ensures an automatic reenergization of the batteries 93 which, in case of interruption of the transmission line current, may replace the current derivation supply and thus ensure an autonomy of operation of the pretreatment circuit 43 for a predetermined period of time such as, for example, 48 hours.

Figure 5:
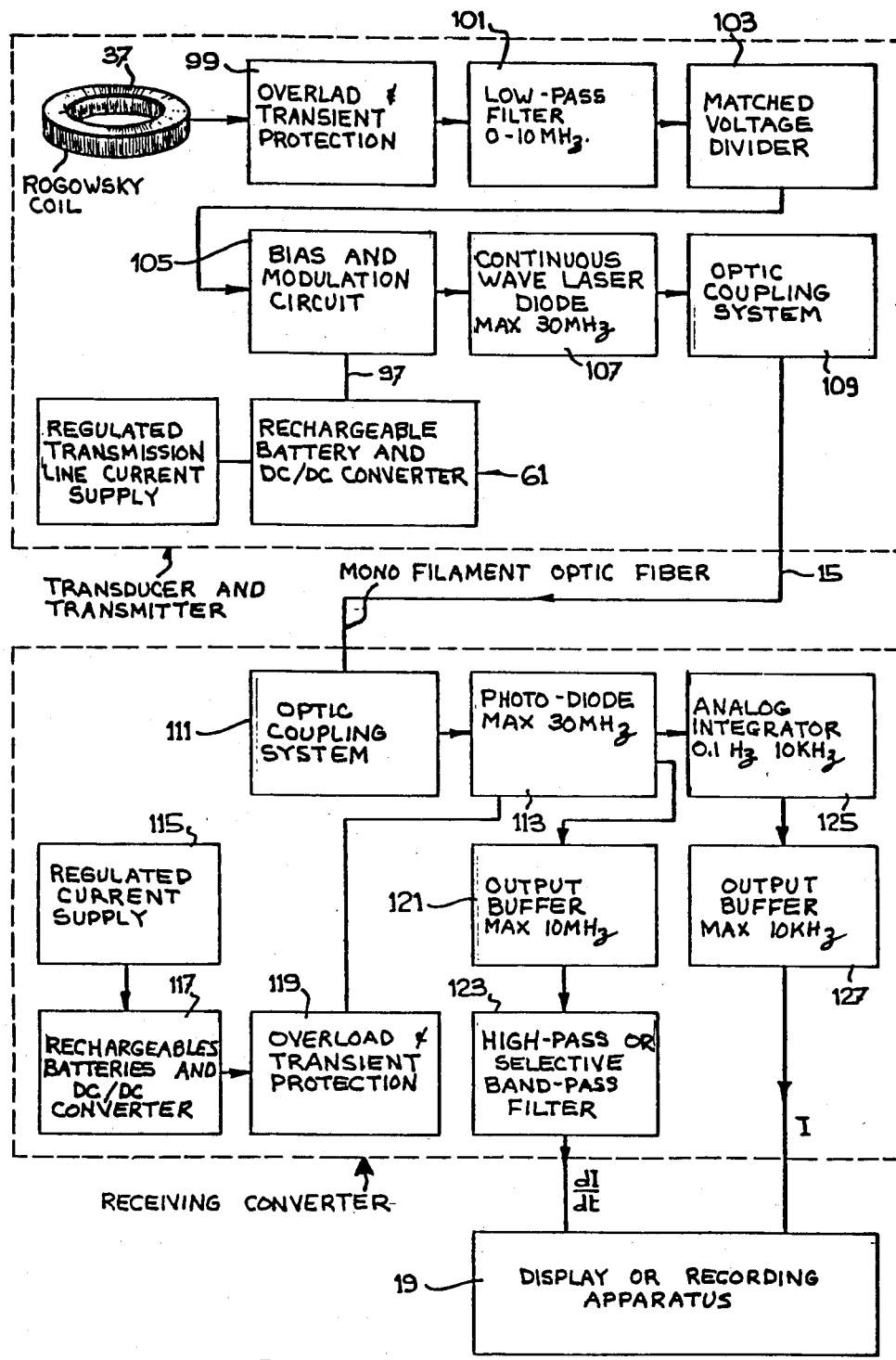
FIG. 5 is a block diagram of the optico-electronic circuit used in the apparatus for measuring a current, shown in schematic manner in FIG. 1.

Referring now to FIG. 5, the pretreatment circuit 43 located inside the housing 11 comprises a signal converter for converting the output voltage at the terminals of the coil 37 into an optical signal, and a fiber optic transmitter for transmitting the optical signal of the converter to the outside of the box-shaped element.

In the specific embodiment shown in FIG. 5, the signal converter comprises a continuous wave laser diode 107 having a three watt power output and a passing part comprised between 0 and 30 MHz. The optic fiber transmitter comprises an optic fiber 15 connected to the laser diode 107 by an optical coupling system 109 of a conventional type. By way of precaution, the laser diode 107 can be protected against overvoltage, high intensity current and electromagnetic noises by means of an overload and transient protection circuit 99, a low pass filter 101 having a pass band, for example, between 0 and 10 MHz, a matched voltage divider 103, and a bias and modulation circuit 105 connected in series between the terminals of Rogowski coil 37 and the laser diode 107. The bias and modulation circuit 105 is itself supplied by the integrated power supply circuit 61 via the cable 97.

As can now be easily understood, the signal $\epsilon$ from the Rogowski coil is transmitted away from the transducer by the optic fiber 15 in analog form; that is, by direct conversion of the electrical signal $\epsilon$ at the terminals of the coil into an optic signal. The advantages of using an analog transmission are that the transmitted analog signal is much easier to shield against external perturbations as compared to digital transmission, and, moreover, analog transmission is simpler than digital transmission.

The optic fiber 15 may have a substantial length (up to 100 meters) without adversely affecting the efficiency of the transmission. For this purpose, use is advantageously made of an optic fiber with a low loss.

The receiving converter 17 comprises a photodiode 113 for transforming the optic signal back into an electrical signal. The photodiode 113 must be selected so that its pass band is substantially identical to that of the laser diode of the sensor. Preferably, the photodiode 113 will be a PIN diode of the commercial type, such as the one commercially sold by Analog Modules Inc. under the tradename LNVA-O-AG-PIN. The photodiode is supplied by a regulated current supply 115 connected to a set of rechargeable batteries and to a DC-DC converter 117 so as to give some autonomy to the whole system in case of interruption of the current supply. The batteries and/or converter 117 supplies the photodiode 113 via an overload and transient protection circuit 119.

Of course, the photodiode 113 receives the optical signal transmitted from the sensor via the optic fiber 15 through an optical coupling system 111.

As previously indicated in the preamble of the present specification, the coil 37 is preferably selected so that the signal $\epsilon$ given by the coil 37 is proportional to the derivative of the intensity of the current flowing in the line L with respect to time.

In this very specific case, the electrical signal at the terminals of the PIN diode 113 can be treated in two different manners according to the sensor user's requirements.

Thus, if the transducer is used only for measuring the current I, the electrical signal at the output of the diode 113 is transmitted to an analog integrating amplifier having a pass band, for example, between 0.1 Hz and 10 KHz. This amplifier is connected to an output buffer having a maximum pass band of 10 KHz. The quality of the results obtained with such a circuit is at least equivalent to the results obtained with the conventional systems. Indeed, with the circuit according to the invention, one can measure the current I flowing in the line with a minimal sensitivity of 1% or less and a minimum phase shift in the operating range of frequency. If the transducer is used for measuring the variations of current in a differentiating way, the electrical signal at the output of the diode 113 is then used as such after having passed through an output buffer 121 having a maximum pass band of 10 MHz and either a high pass filter or a selective band pass filter 123. If necessary, an amplifier with a pass band of, for example, 10 MHz can also be used. The use of a high pass filter 123 has the advantage of removing the frequency harmonics at 60 and 120 Hertz to keep only the high frequency harmonics of the signal. If one wants to measure higher harmonics (3, 10, 100 etc.) or to proceed to a transitory analysis, use can be made of a selective pass band filter rather than of the high pass filter 123. With one or the other way of measurement, the obtained signal can be displayed on any display or recording apparatus 119, such as an oscilloscope, a visicorder or a magnetic tape recorder.

As previously indicated in the preamble of the present disclosure, the main advantage of the transducer 1 according to the invention and of the measurement apparatus incorporating the sensor 1 and a receiving converter at a remote location, lies in that it is operable without any protection, under high currents such as, for example, the interruption current of a circuit breaker, while remaining unsaturated and thus ensuring sensitive measurement of a small post-arc current.

The sensitivity of the transducer is so good that it makes it possible to accurately measure variations of current from 1 Hertz to several Mega Hertz under current intensity as high as 50,000 amps RMS.

As the Rogowski coil is completely embedded inside the conductor itself, it may not be shifted out of its measuring position. Moreover, the "natural" shielding provided to the coil by the body of the transducer according to the invention permits numerous drawbacks to be avoided, which, up to now, have forced those skilled in the art not to use a differentiating Rogowski coil.

Due to its structure, which makes it unsaturable and operable with minimal internal heating, the transducer 1 can be used as current monitor in any kind of circuit, including those subject to short and veryhigh currents. The transducer 1 can also be used in any circuit in which the variations of current with respect to time are substantial and are to be analysed even if they are very short.

Figure 7:
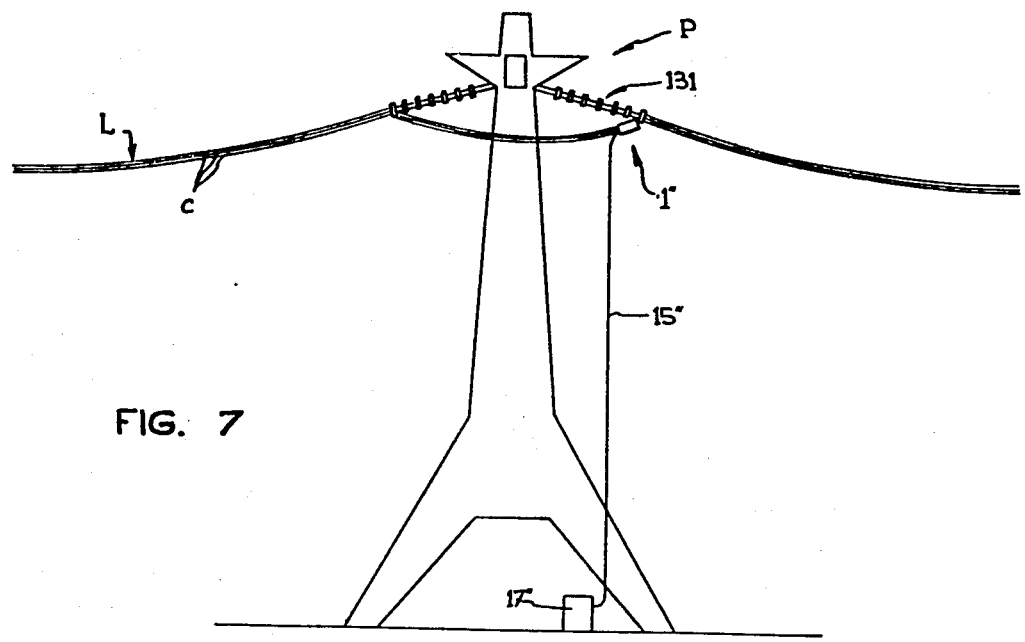
FIG. 7 is a schematic view of a high transmission line provided with another dynamic current transducer according to the invention.
Figure 8:
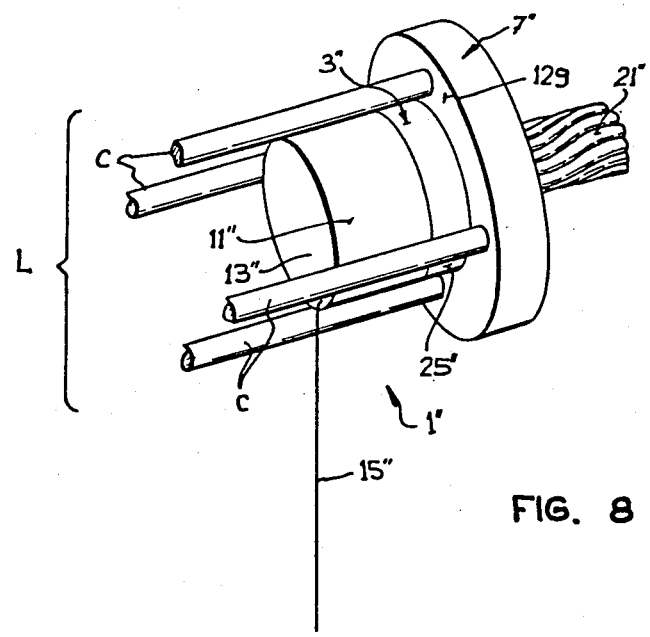
FIG. 8 is a perspective view of the dynamic current transducer schematically shown in FIG. 7.

FIGS. 7 and 8 show the application of the transducer according to the invention to a transmission line. In this application, the transducer is attached to a transmission line tower P. The structural elements of the transducer and of the measurement apparatus incorporating this transducer have been identified in these figures with the same reference numerals as they were previously in FIGS. 1 to 3, with an addition of a double prime (").

As can be seen, the transducer 1" is fixed to the tower P adjacent one of the insulators 131 to which is connected to the line L. In the case of a high voltage transmission line, the line L comprises a plurality of cables C. To connect the transducer 1" to these cables C, the external periphery of the second conducting element 7" is widened so as to provide a peripheral, outwardly projecting surface 129 onto which the cables C can be connected. In this case, it can be understood that no terminal connector 9 is necessary. The first conducting element 3" of the transducer 1" has its cylindrical body extended by a terminal connector 21" specially shaped to be connected to the conventional coupling system used in most of the transmission lines at the end of insulator 131. Of course, the transducer 1" is provided with a box-shaped element 11" and is connected to the ground by an optic fiber 15" as previously indicated, provided that the selected transmission scheme is sufficient to ensure the insulation which is necessary at a given voltage. Indeed, if the insulation is not sufficient, it is necessary to supply the signal of the sensor to a secondary protecting insulator.

The foregoing description of the preferred embodiments is intended to illustrate the present invention but should not be considered to limit its scope in any way. Clearly, numerous additions or other modifications can be made to the invention without departing from the scope thereof, as set forth in the appended claims.

What is claimed is:

1. A dynamic current transducer comprising:
 a first conducting element in which a current to be measured flows, said first conducting element having a first end and a second end,
 a differentiating Rogowski coil extending around said first conducting element to define a plane, said Rogowski coil having a non-saturable dielectric core, a pair of terminals, and structural characteristics selected so that the ratio of self-inductance of the coil with respect to the total impedance viewed by said coil is much smaller than the period of the current to be detected when this current is alternating, a first terminal connector on said first end of said first conducting element, a second conducting element mounted to said first conducting element so as to cover the external periphery of said Rogowski coil, said second conducting element having a first end and a second end, said first end of said second conducting element being electrically connected to the second end of said first conducting element, and a second terminal connector mounted on said second conducting element second end on the same side of said plane as said first terminal connector to force the current flowing between the first and second terminal connectors via the first and second conducting elements to flow all around the periphery of said coil and thus to shield said coil.

2. The current transducer of claim 1, wherein the first conducting element comprises a solid, cylindrical body having a diameter smaller than the internal diameter of the coil, and a solid base extending perpendicularly to the body, said solid base having a diameter greater than the external diameter of the coil, and the second conducting element comprises a sleeve having an internal diameter slightly greater than the external diameter of the cylindrical body to avoid any contact with the same when the first and second elements are connected to each other, said sleeve having an external diameter sufficient to contact the external periphery of the base all around the coil.

3. The current transducer of claim 2, wherein the base of the first conducting element comprises an annular groove adjacent the cylindrical body for receiving and holding the coil.

4. The current transducer of claim 3, further comprising an annular shoulder extending around an internal periphery of an end of the sleeve, said end being in contact with the base, said annular shoulder being of a small height and being sized and positioned to match the groove in the base so as to self-position the second conducting element with respect to the first one.

5. The current transducer of claim 2, further comprising an annular recess around an internal periphery of an end of the sleeve said end being in contact with the base for receiving and holding the coil.

6. The current transducer of claim 3, wherein the first and second conducting elements are fixed to each other by bolts screwed into threaded holes.

7. The current transducer of claim 4, wherein the first and second conducting elements are fixed to each other by bolts screwed into threaded holes.

8. The current transducer of claim 5, wherein the first and second conducting elements are fixed to each other by bolts screwed into threaded holes.

9. The current transducer of claim 2, further comprising a box-shaped element fixed to the base of the first conducting element, and a means for receiving and transmitting the output voltage generated at the terminals of the coil, said receiving and transmitting means comprising a pretreatment circuit for pretreating the output voltage value measured at the terminals of the coil, said pretreatment circuit being received in said box-shaped element, and the coil being connected to said pretreatment circuit inside said box-shaped element via a small opening extending through the base.

10. The current transducer of claim 9, wherein the pretreatment circuit located inside the box-shaped element comprises a converter for converting the output voltage signal generated at the terminals of the coil passing through the small opening into an optical signal, and a fiber optic transmitter for transmitting the optical signals from the converter to a location outside of the box-shaped element.

11. The current transducer of claim 10, wherein the signal converter consists of a continuous wave laser diode connected to a bias and modulation circuit having a maximal frequency pass band of 30 MHz and the fiber optic transmitter comprises an optic fiber extending out of the box-shaped element.

12. The current transducer of claim 11, wherein the pretreatment circuit is supplied by at least one rechargeable battery.

13. The current transducer of claim 11 for use on a high voltage transmission line, wherein the pretreatment circuit is supplied by an integrated main transformer said main transformer being itself supplied by a current tapping element attached to the sensor.

14. The current transducer of claim 13, wherein the main transformer comprises a toroidal coil mounted onto a ferrite core and the current tapping element comprises a fourth conducting element fixed onto the middle of the bottom of the base of the transducer, said fourth conducting element having an annular groove for receiving the main transformer coil and a pair of surfaces in contact with the bottom surface of the base for tapping the current circulating through this base and forcing it to flow through the middle of the main transformer toroidal coil.

15. The current transducer of claim 14, wherein the contact surfaces of the fourth conducting element are sized to correspond to the range of currents flowing through the transmission line, and the main transformer coil supplies the pretreatment circuit through an adjustable voltage regulating transformer, a rectifying circuit and a shunt regulator.

16. The current transducer of claim 9, wherein the box-shaped element is provided with cooling fins on at least one part of its external surface.

17. The current transducer of claim 12, wherein the box-shaped element is provided with cooling fins on at least one part of its external surface.

18. The current transducer of claim 13, wherein the box-shaped element is provided with cooling fins on at least one part of its external surface.

19. The current transducer of claim 9, wherein the box-shaped element is provided at one end with an internal peripheral edge and at the other end with a removable bottom, said box-shaped element being fixed in a removable manner onto the base by its one end, using bolts passing through said peripheral edge.

20. The current transducer of claim 12, wherein the box-shaped element includes one end with an internal peripheral edge and at the other end with a removable bottom, said box-shaped element being fixed in a removable manner onto the base by its one end, using bolts passing through said peripheral edge.

21. The current transducer of claim 13, wherein the box-shaped element includes one end with an internal peripheral edge and a removable bottom, said box-shaped element being fixed in a removable manner to the base through said peripheral edge.

22. The current transducer of claim 9, wherein the pretreatment circuit includes a protection circuit against over voltages, high current peaks and electromagnetic interferences.

23. The current transducer of claim 12, wherein the pretreatment circuit includes a protection circuit against over voltages, high current peaks and electromagnetic interferences.

24. The current transducer of claim 13, wherein the pretreatment circuit includes a protection circuit against over voltages, high current peaks and electromagnetic interferences.

25. The current transducer of claim 11 in combination with an apparatus for measuring a current, comprising a receiving converter connected to the optic fiber extending out of the box-shaped element of the sensor, said receiving converter comprising a photodiode having a frequency pass band substantially identical to the pass band of the laser diode forming part of the current transducer, said photodiode giving an output signal directly proportional to the variation of current flowing through the transducer with a sensitivity substantially constant under a high current phase or under a transitory phase such as the one encountered with a post-arc current.

26. The apparatus of claim 25, wherein the receiving converter also comprises an output buffer connected to the receiving diode.

27. The apparatus of claim 26, wherein the receiving converter also comprises a selective pass band filter connected to the output buffer.

28. The apparatus of claim 25 for measuring the intensity of the current flowing through the transducer, wherein the receiving converter also comprises an integrator-amplifier having a pass band ranging between 0.1 and 10 kHz, said integrator-amplifier being connected to the receiving diode for treating the output signal of said receiving diode.

29. The apparatus of claim 28, wherein the receiving converter also comprises an output buffer.

30. The apparatus of claim 27, further comprising an apparatus for displaying or recording the output signal of the output buffer without particular interfaces.

31. The apparatus of claim 29, further comprising an apparatus for displaying or recording the output signal of the output buffer without particular interfaces.

32. The apparatus of claim 27, wherein the photodiode is a PIN diode.

33. The apparatus of claim 29, wherein the photodiode is a PIN diode.

34. The current transducer of claim 1 further comprising a means for receiving and transmitting the output voltage generated at the terminals of the coil by the current flowing in the first conducting element passing through said coil, said output voltage being directly proportional to the variation of current in the first conducting element.

* * * * *